United States Patent
Camina et al.

(10) Patent No.: US 10,880,462 B2
(45) Date of Patent: Dec. 29, 2020

(54) MINIATURE VIDEO RECORDER

(71) Applicant: AUDIO TECHNOLOGY SWITZERLAND S.A., Romanel-sur-Lausanne (CH)

(72) Inventors: Patrick Camina, Romanel-sur-Lausanne (CH); Loic Ray, Romanel-sur-Lausanne (CH); Thierry Frank, Romanel-sur-Lausanne (CH)

(73) Assignee: AUDIO TECHNOLOGY SWITZERLAND S.A., Romanel-sur-Lausanne (CH)

( * ) Notice: Subject to any disclaimer, the term of this patent is extended or adjusted under 35 U.S.C. 154(b) by 0 days.

(21) Appl. No.: 16/261,831

(22) Filed: Jan. 30, 2019

(65) Prior Publication Data
US 2020/0244847 A1 Jul. 30, 2020

(51) Int. Cl.
*H04N 5/225* (2006.01)
*G02B 13/00* (2006.01)
(Continued)

(52) U.S. Cl.
CPC ......... *H04N 5/2253* (2013.01); *G02B 13/001* (2013.01); *H01L 27/14627* (2013.01);
(Continued)

(58) Field of Classification Search
CPC ............... H04N 5/2253; H04N 5/2252; H04N 5/23241; H01L 27/148; H01L 27/14643; H01L 27/14627
See application file for complete search history.

(56) References Cited

U.S. PATENT DOCUMENTS 9,191,559 B2 * 11/2015 Shimizu ............... H04N 5/2254
9,768,225 B2 *  9/2017 Vittu ................. H01L 27/14685
(Continued)

FOREIGN PATENT DOCUMENTS

EP            1471730          10/2004

OTHER PUBLICATIONS

European Search Report issued in EP 20 15 2551 dated Jun. 5, 2020.

*Primary Examiner* — Ngoc Yen T Vu
(74) *Attorney, Agent, or Firm* — DLA Piper LLP (US)

(57) ABSTRACT

The size of the camera sensor devices allows a great number of applications such as medical applications. The image sensor itself is approximately the size of a cube of 1 mm$^3$. Such devices are used for endoscopy in the medical field or to be integrated in alarm clock or a watch for surveillance purpose. As a consequence, it is proposed a camera assembly comprising a first and a second cover, an aperture located on the first cover, an electronic module mounted on the inner face of the first cover, a camera module comprising an image sensor, a lens mounted on the image sensor and in contact with the inner face of the first cover, the camera module further comprising a film on which the image sensor is mounted and having conductive tracks extending to periphery of the film, and a frame having lateral contacts, the camera module being maintained centered with the aperture of the first cover by glue points, the lateral contacts of the camera module being connected with the electronic module by a plurality of conductive glue points.

12 Claims, 2 Drawing Sheets

(51) Int. Cl.

| | | |
|---|---|---|
| *H01L 27/146* | (2006.01) | |
| *H04N 5/232* | (2006.01) | |
| *H04R 1/02* | (2006.01) | |
| *H04R 1/04* | (2006.01) | |
| H01L 27/148 | (2006.01) | |
| H02J 7/00 | (2006.01) | |
| H02J 7/02 | (2016.01) | |

(52) U.S. Cl.
CPC ....... *H04N 5/2252* (2013.01); *H04N 5/23241* (2013.01); *H04R 1/028* (2013.01); *H04R 1/04* (2013.01); *G03B 2217/002* (2013.01); *H01L 27/148* (2013.01); *H01L 27/14643* (2013.01); *H02J 7/00* (2013.01); *H02J 7/025* (2013.01)

(56) References Cited

U.S. PATENT DOCUMENTS

| | | | |
|---|---|---|---|
| 10,171,715 B2 * | 1/2019 | Wang | H04N 5/2253 |
| 2004/0189862 A1 | 9/2004 | Gustavsson et al. | |
| 2005/0285973 A1 | 12/2005 | Singh et al. | |
| 2008/0273111 A1 | 11/2008 | Gustavsson et al. | |
| 2010/0321544 A1 * | 12/2010 | Matsuo | H01L 24/14 |
| | | | 348/294 |
| 2011/0254964 A1 | 10/2011 | Zhang | |
| 2015/0085185 A1 | 3/2015 | Tan | |
| 2017/0245360 A1 * | 8/2017 | Jung | H05K 5/04 |
| 2017/0330847 A1 * | 11/2017 | Dobashi | G02B 13/16 |
| 2019/0014242 A1 | 1/2019 | Piekarski et al. | |

* cited by examiner

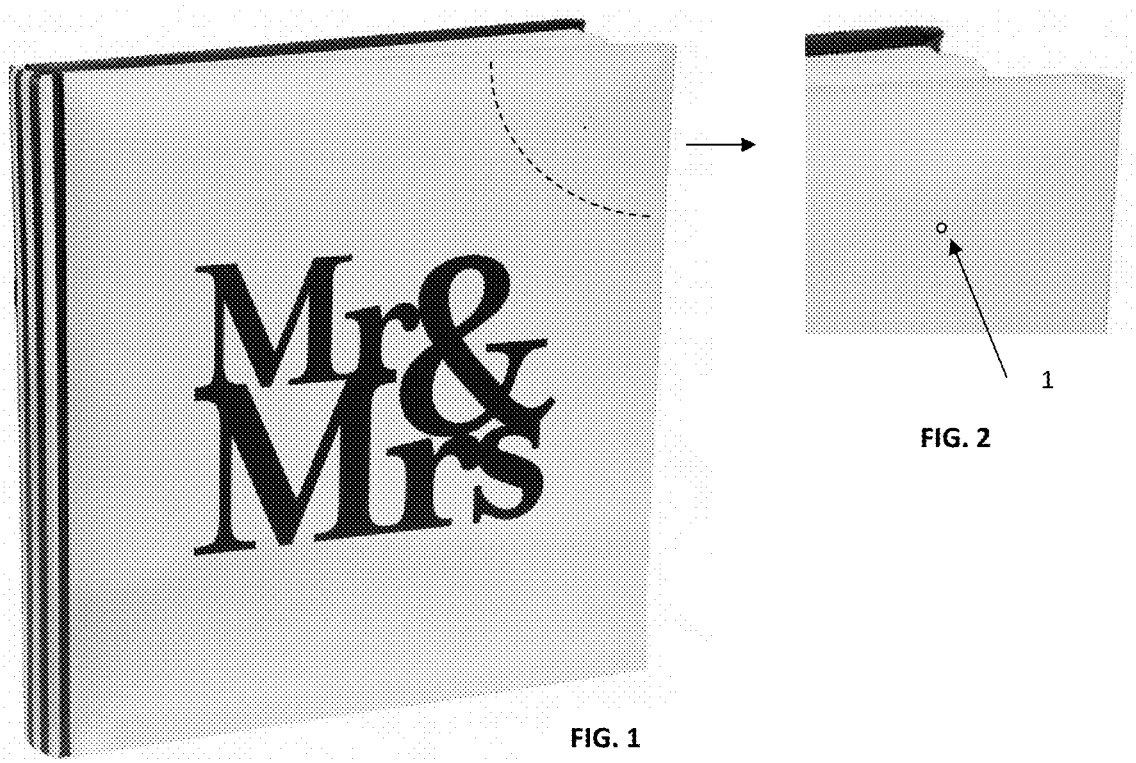
FIG. 1
FIG. 2
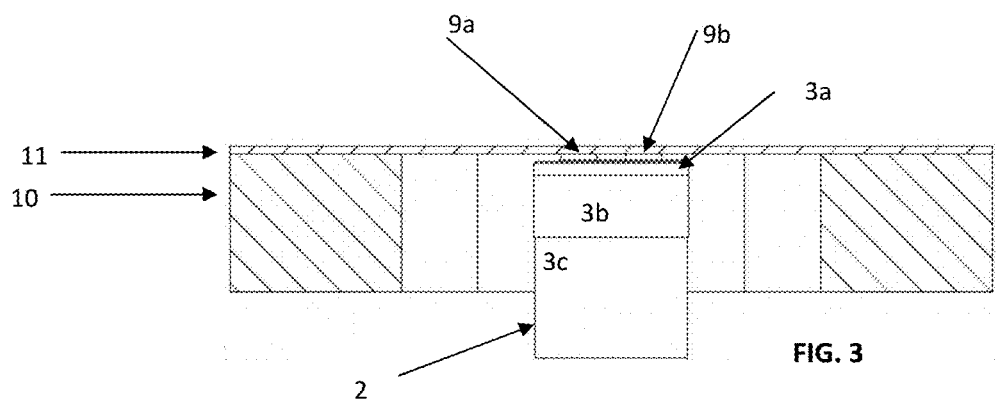
FIG. 3

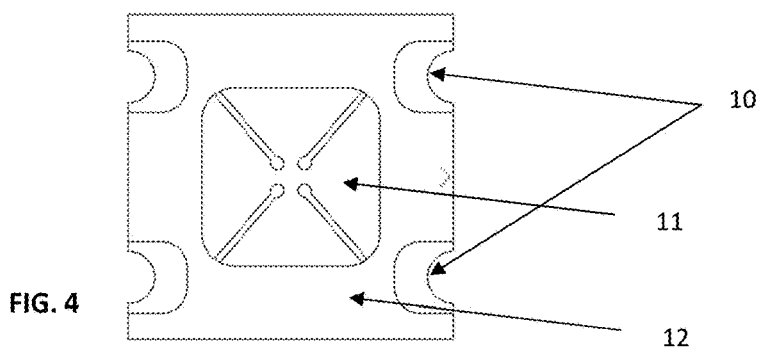
FIG. 4
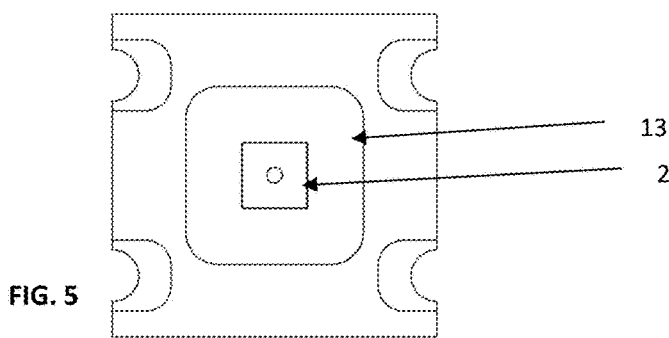
FIG. 5
FIG. 6
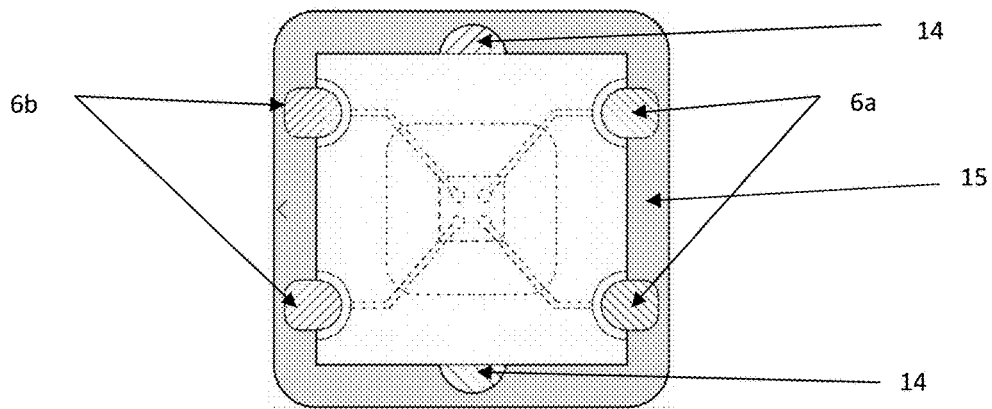
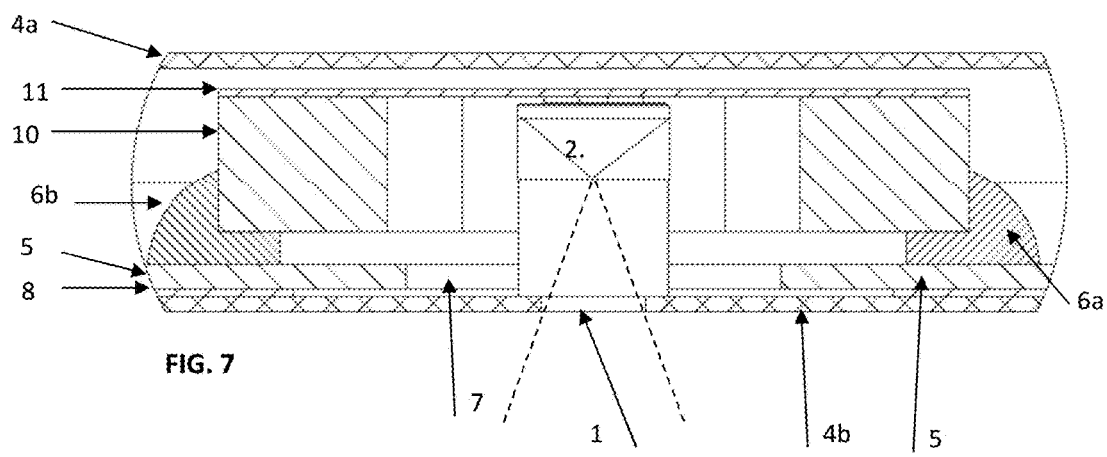
FIG. 7

MINIATURE VIDEO RECORDER

INTRODUCTION

The size of the camera sensor devices allows a great number of applications such as medical applications or surveillance devices. The image sensor itself is approximately the size of a cube of 1 mm$^3$. Such devices are used for endoscopy in the medical field or to be integrated in alarm clock or a watch for surveillance purpose.

BACKGROUND ART

Several solutions have been proposed to implement a video camera into a small device. The document US 2011/0254964A1 describes an ear-hanging miniature video camera. The ear-hanging miniature video camera comprises a video camera head, a control unit for controlling the operation of the video camera head, a storage unit for storing the information obtained by the video camera head and a shell for accommodating the video camera head, the control unit and the storage unit. In this example, the thickness of the final device is not an issue, the camera being mounted into housing large enough to accommodate the CCD chip and its electronics.

The challenge is to propose a solution for a CCD device integrated in a slim and flat housing such as a button, a book cover or a key hanger.

SHORT DESCRIPTION

The aim of the present invention is to embed an image sensor or camera in an housing that is discrete and slim. In order to avoid the camera to be noticeable, the aperture should be small as possible, therefore the alignment of the image sensor with the aperture is a key element. The thickness of the assembly is mainly defined by the height of the image sensor.

The present invention proposes a solution to assemble an image sensor with its electronic in such a way that the image sensor is aligned with the center of the aperture.

This is achieved by a camera assembly comprising a first and a second cover, an aperture located on the first cover, an electronic module mounted on the inner face of the first cover, a camera module comprising an image sensor, a lens mounted on the image sensor and in contact with the inner face of the first cover, the camera module further comprising a film on which the image sensor is mounted and having conductive tracks extending to the periphery of the film, and a frame having lateral contacts, the camera module being maintained centered with the aperture of the first cover by glue points, the lateral contacts of the camera module being connected with the electronic module by a plurality of conductive glue points.

This is also achieved with a method to manufacture a camera assembly comprising a first and a second cover, an aperture located on the first cover, an electronic module, the method comprising:

providing a camera module comprising an image sensor and a lens, the image sensor being mounted on a film a having conductive tracks extending to the periphery of the film, the camera module comprising a frame with lateral contacts in connection with the conductive tracks, mounting the electronic module on the inner face of the first cover, centering the image sensor with the aperture of the first cover and gluing the frame of the camera module with the electronic module, depositing conductive glue on the lateral contacts in order to create an electrical contact with the electronic module.

One key factor is handle two elements separately, in one side the electronic module and in the other side the camera module. The camera module, in particular the image sensor should be centered with the aperture of the first cover so that the size of the aperture does not alter the viewing angle of the image sensor.

In case that a strong consolidation is desired, epoxy resin is poured around the frame binding the frame with the electronic module.

SHORT DESCRIPTION OF THE FIGURES

The present description will be better understood with the help of the figures, namely:

FIG. 1 illustrates one possible embodiment of the camera assembly embedded into a book cover.

FIG. 2 illustrates an enlarged part of the book cover showing the aperture of the camera, FIG. 3 illustrates a camera module comprising the image sensor, FIG. 4 illustrates one view of the film with the frame, FIG. 5 illustrates a view of the camera module, FIG. 6 illustrates the top view of the camera module, FIG. 7 illustrates a cross-section of the camera assembly.

DETAILED DESCRIPTION

The FIG. 1 illustrates a book in which a camera assembly has been integrated in the cover. The only visible part of the camera is a dot having a size smaller than a millimeter. This is the aperture 1 through which the light accesses the image sensor.

En enlarged version of the book cover is illustrated at the FIG. 2 with the aperture 1 clearly visible. Without paying particular attention, the aperture is unnoticeable.

The FIG. 3 illustrates the camera module. The camera module comprises three main elements, the image sensor 3 with its lens 2, the film 11 and the frame 12.

The image sensor 2 comprises an electronic sensor 3a, a first lens 3b and second lens 3b. The electronic sensor 3a is the one in charge of converting the light into an electric signal. Two types of image sensors can be used, the CCD and the CMOS sensors.

Once the light has reached the electronic sensor 3a, the next step is to read the value (accumulated charge) of each cell in the image. In a CCD device, the charge is actually transported across the chip and read at one corner of the array. An analog-to-digital converter turns each pixel's value into a digital value. In most CMOS devices, there are several transistors at each pixel that amplify and move the charge using more traditional wires. The CMOS approach is more flexible because each pixel can be read individually.

The electronic module 5 comprises the elements necessary to process the video signal originating from the image sensor 2. In particular, the electronic module 5 comprises a processing module to read the data of the image sensor 2 and to store the video data into a memory. The electronic module 5 further comprises the memory to store the video data. The video data are stored in raw mode which does not degrade image quality.

According to one embodiment the video data are stored in compressed mode and the electronic module 5 comprises a compression module to compress the video data into a compressed video stream such as MPEG-2.

Optionally, the electronic module can comprise an audio acquisition module, connected to a microphone. For that purpose, the first cover comprises a second aperture to allow the sound to reach the microphone. The audio acquisition module converts the audio signal into digital data and access the memory to store the audio data.

The electronic module is connected with a battery to power the components of the electronic module and the image sensor.

According to one embodiment, the electronic module 5 comprises a connector (not illustrated) blending into an image applied on the first or second cover. This connector can be used not only to recharge the battery but also to access the data stored into the memory or configure the video (and audio) acquisition module.

According to one embodiment, the electronic module comprises a wireless charging module allowing to convert the magnetic field produced by an external wireless charger into current to charge the internal battery. The wireless connection can be also used to access the data stored into the memory or configure the video (and audio) acquisition module.

The image sensor 2 comprises in our example two microlenses 3b and 3c. The role of the microlenses is to focus light into the electronic sensor 3a. The dotted lines define the viewing angle of the image sensor and define the necessary aperture while including the image sensor into a housing. A misalignment of the image sensor with the aperture has the consequence that part of the image will not reach the sensor.

The camera module of the FIG. 3 comprises the film 11 and the frame 12. The film 11 is a thin flexible circuit (Flexible Flat Cable) comprising the conductive tracks and the pad for receiving the image sensor. The FIG. 4 illustrates a bottom view of the film and frame before receiving the image sensor. The conductive tracks of the film extend up to the periphery of the film and are connected with electrical contacts 10 formed on the side of the frame. The role of these electrical contacts is to connect the conductive paths of the film up to the electronic module as illustrated in the FIG. 7.

The FIG. 5 illustrates the camera assembly ready for the placement with the electronic module. The region were the conductive tracks were visible in the FIG. 4 is now covered by the image sensor 2. The region 13 between the image sensor 2 and the frame 12 is filled by epoxy resin to consolidate the link between the image sensor 2 and the frame 12.

The image sensor 2 is mounted on a film 11 preferably by soldering the electrical contacts 9a, 9b of the image sensor to the electrical contacts of the film 11. The film 11 comprises electrical conductors to connect with the electrical contacts 10 of the frame.

The manufacture of the camera assembly is carried out in two steps. The first step is to mount the electronic module on the first cover 4b. Various methods can be used such as double-side tape or glue. On the FIG. 7, we can see the electronic module 5 mounted on the inner face of the first cover 4b with a self-adhesive film 8. The mounting of the electronic module 5 leaves an opening 7 around the aperture of the first cover 4b.

The second step is the mounting of the camera module previously assembled. In order to minimize the distance between the first cover 4b and the second cover 4a, the lens 2 of the image sensor 2 is directly in contact with the inner first cover 4b. The lateral position is adjusted so that the center of the image sensor 2 is aligned with the center of the aperture 1. At that time, the only contact of the image sensor 2 with the rest of the elements is through the lens resting on the inner first cover 4b. The image sensor 2 is fixed in that position with the electronic module via glue points 14 (in the FIG. 6). The fact that the camera module is an independent part allows an easy positioning with the aperture 1. When the positioning is satisfactorily, the glue points 14 are activated by for example UV light and the camera module is fixed in that position. As long as the UV light has not been used, the glue remains fluid and turn into adhesive with the exposition of UV light.

When the camera module is fixed at the right position with the electronic module 5, the camera module can be connected via the electronic module 5. Preferably a cold connection is used with a by a conductive glue 6a, 6b (visible in the FIGS. 6 and 7). This conductive glue connects the lateral contacts 10 of the frame of the camera module with the pads of the electronic module 5.

In order to reinforce the resistance to flexion or torsion, an epoxy resin 15 is poured around the frame of the camera module, thus covering the area with the electrical contacts 6a, 6b and the glue points 14.

These two steps process allows a precise alignment of the image sensor with the aperture.

The invention claimed is:

1. A camera assembly comprising a first and a second cover, an aperture located on the first cover, an electronic module mounted on the inner face of the first cover, a camera module comprising an image sensor, a lens mounted on the image sensor and in contact with the inner face of the first cover, the electronic module comprising components for processing a video signal from the image sensor, the camera module further comprising a film on which the image sensor is mounted and having conductive tracks extending to periphery of the film, and a frame having lateral contacts, the camera module being maintained centered with the aperture of the first cover by glue points, the lateral contacts of the camera module being connected with the electronic module by a plurality of conductive glue points.

2. The camera assembly of claim 1, further comprising an epoxy resin around the frame and linking the frame with the electronic module.

3. The camera assembly of claim 1, further comprising an epoxy resin to consolidate the link between the image sensor and the frame.

4. The camera assembly of claim 1, further comprising a microphone and an audio processing module.

5. The camera assembly of claim 1, wherein the image sensor is a CCD image sensor.

6. The camera assembly of claim 1 wherein the image sensor is a CMOS image sensor.

7. The camera assembly of claim 1, further comprising a battery to power the electronic module, said battery comprising a charging circuit having connections on the first or second cover.

8. The camera assembly of claim 7, wherein the connections are located on the first cover and blending on an image applied on the first cover.

9. The camera assembly of claim 1, further comprising a battery to power the electronic module, said battery comprising a wireless charging circuit.

10. A method to manufacture a camera assembly comprising a first and a second cover, an aperture located on the first cover, and an electronic module, the method comprising:

providing a camera module comprising an image sensor and a lens, the image sensor being mounted on a film a having conductive tracks extending to the periphery of the film, the camera module comprising a frame with lateral contacts in connection with the conductive tracks, mounting the electronic module on the inner face of the first cover, the electronic module comprising components for processing a video signal from the image sensor, centering the image sensor with the aperture of the first cover and gluing the frame of the camera module with the electronic module, and depositing conductive glue on the lateral contacts in order to create an electrical contact with the electronic module.

11. The method of claim 10, further comprising providing epoxy resin around the frame to link the frame with the electronic module.

12. The method of claim 10, further comprising providing epoxy resin into the space formed between the frame and the image sensor.

* * * * *